United States Patent
Doczy et al.

(10) Patent No.: US 7,126,199 B2
(45) Date of Patent: Oct. 24, 2006

(54) MULTILAYER METAL GATE ELECTRODE

(75) Inventors: Mark L. Doczy, Beaverton, OR (US);
Justin K. Brask, Portland, OR (US);
Jack Kavalieros, Portland, OR (US);
Chris Barns, Portland, OR (US);
Matthew V. Metz, Hillsboro, OR (US);
Suman Datta, Beaverton, OR (US);
Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/951,073

(22) Filed: Sep. 27, 2004

(65) Prior Publication Data
US 2006/0065939 A1   Mar. 30, 2006

(51) Int. Cl.
*H01L 29/94* (2006.01)

(52) U.S. Cl. .................. 257/412; 257/213; 257/288; 257/E29.158; 257/E29.159; 257/E29.16

(58) Field of Classification Search .................. None
See application file for complete search history.

(56) References Cited

U.S. PATENT DOCUMENTS

| | | | |
|---|---|---|---|
| 5,134,083 A * | 7/1992 | Matthews | |
| 5,424,246 A * | 6/1995 | Matsuo et al. | |
| 6,159,782 A | 12/2000 | Xiang et al. | |
| 6,240,199 B1 * | 5/2001 | Manchanda et al. | |
| 6,271,132 B1 | 8/2001 | Xiang et al. | |
| 6,291,282 B1 | 9/2001 | Wilk et al. | |
| 6,511,911 B1 * | 1/2003 | Besser et al. | |
| 6,696,345 B1 | 2/2004 | Chau et al. | ............ 438/387 |
| 6,713,846 B1 * | 3/2004 | Senzaki | |
| 6,784,472 B1 * | 8/2004 | Iriyama et al. | |
| 2002/0163012 A1 * | 11/2002 | Nihei et al. | |
| 2003/0080387 A1 * | 5/2003 | Cho et al. | |
| 2003/0119292 A1 | 6/2003 | Lee et al. | |
| 2004/0002202 A1 * | 1/2004 | Horsky et al. | |
| 2004/0084734 A1 * | 5/2004 | Matsuo | |
| 2004/0171222 A1 * | 9/2004 | Gao et al. | |

FOREIGN PATENT DOCUMENTS

WO    WO 01/97257    * 12/2001

OTHER PUBLICATIONS

"CRC Handbook of Chemistry and Physics," ed. David Lide, 2000, CRC Press, 81st edition, p. 12-130.*

* cited by examiner

Primary Examiner—Nathan J. Flynn
Assistant Examiner—Kevin Quinto
(74) Attorney, Agent, or Firm—Trop, Pruner & Hu, P.C.

(57) ABSTRACT

A complementary metal oxide semiconductor integrated circuit may be formed with NMOS and PMOS transistors that have high dielectric constant gate dielectric material over a semiconductor substrate. A metal barrier layer may be formed over the gate dielectric. A workfunction setting metal layer is formed over the metal barrier layer and a cap metal layer is formed over the workfunction setting metal layer.

5 Claims, 4 Drawing Sheets

MULTILAYER METAL GATE ELECTRODE

BACKGROUND

The present invention relates to semiconductor devices, in particular, semiconductor devices with metal gate electrodes.

Complementary metal oxide semiconductor (CMOS) devices with very thin gate dielectrics made from silicon dioxide may experience unacceptable gate leakage currents. Forming the gate dielectric from certain high dielectric constant (k) dielectric materials, instead of silicon dioxide, can reduce gate leakage. Because such a dielectric may not be compatible with polysilicon, it may be desirable to replace polysilicon based gate electrodes with metal gate electrodes in devices that include high-k gate dielectrics.

To form metal NMOS and PMOS gate electrodes that have appropriate workfunctions, it may be necessary to form them from different materials—one that ensures an acceptable workfunction for the NMOS gate electrode, and another that ensures an acceptable workfunction for the PMOS gate electrode. A replacement gate process may be used to form metal NMOS and PMOS gate electrodes from different metals. In that process, a first polysilicon layer, bracketed by a pair of spacers, is removed selectively to a second polysilicon layer to create a trench between the spacers. The selective removal may include the use of selective etchant, such as tetramethyl ammonium hydroxide (TMAH) or $NH_4OH$, with sonication. The trench is filled with a first metal. The second polysilicon layer is then removed, and replaced with a second metal that differs from the first metal.

In a subtractive process for forming metal gate transistors with high-k dielectric layers, the dielectric layer is covered by different metal layers and a polysilicon masking layer. These layers are then etched to define NMOS and PMOS gate electrodes.

With existing metal gate over high-k dielectric structures, the workfunction metal may exhibit reactivity with conventional semiconductor processes, especially wet etch processes. In addition, the workfunction metal may not adhere well to the gate dielectric. Also, existing metal gate structures may not meet targeted threshold voltages, may have insufficient mobility and gate dielectric thickness may be excessive.

Thus, there is a need for a better structures for metal gate transistors.

Features shown in these figures are not intended to be drawn to scale.

DETAILED DESCRIPTION

Figure 1:
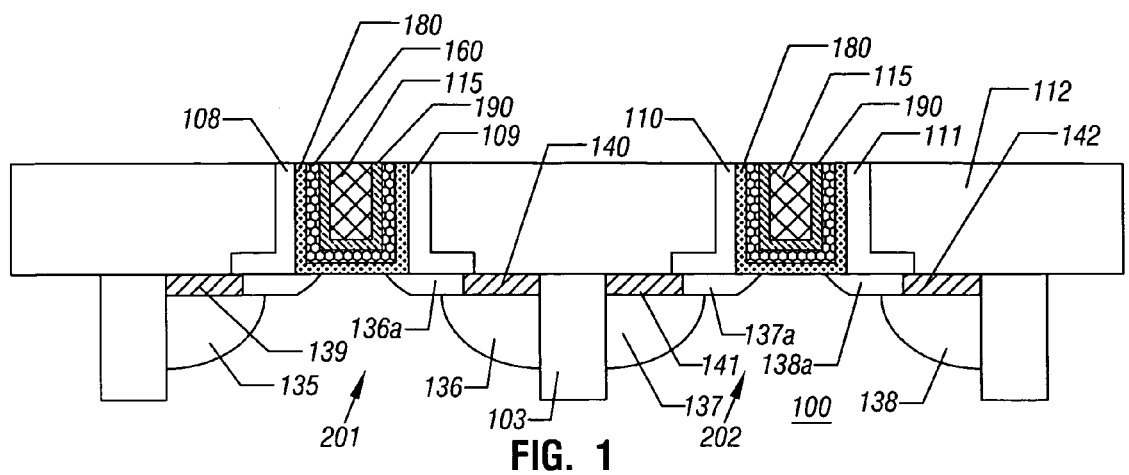
FIGS. 1–10 represent cross-sections of structures that may be formed when carrying out an embodiment of the method of the present invention.

Referring to FIG. 1, a stack, formed on a substrate 100, may include a high-k gate dielectric 180, a metal barrier layer 160, a workfunction setting metal layer 190, and a cap metal layer 115, in one embodiment. As used herein, high-k means having a dielectric constant greater than 10.

Substrate 100 may comprise a bulk silicon or silicon-on-insulator substructure. Alternatively, substrate 100 may comprise other materials—which may or may not be combined with silicon—such as: germanium, indium antimonide, lead telluride, indium arsenide, indium phosphide, gallium arsenide, or gallium antimonide. Although a few examples of materials from which substrate 12 may be formed are described here, any material that may serve as a foundation upon which a semiconductor device may be built falls within the spirit and scope of the present invention.

Materials that may be used to form an n-type metal layer 190 include hafnium, zirconium, titanium, tantalum, aluminum, and their alloys, e.g., metal carbides that include these elements, i.e., hafnium carbide, zirconium carbide, titanium carbide, tantalum carbide, and aluminum carbide. An n-type metal layer 190 may be formed using well known physical vapor deposition (PVD) or chemical vapor deposition (CVD) processes, e.g., conventional sputter or atomic layer CVD processes.

N-type metal layer 190 may serve as a metal NMOS gate electrode that, in one embodiment, has a workfunction that is between about 3.9 eV and about 4.2 eV. The layer 190 may be about 100 Angstroms thick to facilitate patterning in one embodiment.

Materials that may be used to form p-type metal layer 190 include ruthenium, palladium, platinum, and metal nitrides including titanium, tungsten, tantalum, ruthenium, and titanium aluminum nitride. P-type metal layer 190 may be formed using well known PVD or CVD processes, e.g., conventional sputter or atomic layer CVD processes.

P-type metal layer 190 may serve as a metal PMOS gate electrode with a workfunction that is about 4.9 eV and about 5.2 eV in one embodiment. The layer 190 may be about 100 Angstroms thick in one embodiment.

Some of the materials that may be used to make high-k gate dielectric 180 include: hafnium oxide, hafnium silicon oxide, lanthanum oxide, zirconium oxide, zirconium silicon oxide, tantalum oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, and aluminum oxide. Although a few examples of materials that may be used to form high-k gate dielectric layer 180 are described here, that layer may be made from other materials.

High-k gate dielectric layer 180 may be formed on substrate 100 using a conventional deposition method, e.g., a conventional chemical vapor deposition ("CVD"), low pressure CVD, or physical vapor deposition ("PVD") process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between substrate 100 and high-k gate dielectric layer 180. The CVD reactor may be operated long enough to form a layer with the desired thickness. In some applications, high-k gate dielectric layer 180 may be less than about 60 Angstroms thick, and, in one embodiment, between about 5 Angstroms and about 40 Angstroms thick.

In accordance with one embodiment of the present invention, the layer 160 may be a metal barrier. It may be a nitrogen containing metal such as titanium nitride, tantalum nitride, zirconium nitride, or hafnium nitride, to mention a few examples. It may improve adhesion of the workfunction setting metal layer 190 to the high-k dielectric layer 180 in some embodiments. The layer 160 also provides a barrier against diffusion from the workfunction setting metal layer 190 to the high-k dielectric layer 180. Advantageously, the metal barrier layer 160 may be thin enough to allow the workfunction of the metal in the layer 190 above to effect device turn-on. In one embodiment, the metal barrier layer 160 is less than 30 Angstroms.

The layer 190 may be a workfunction metal optimized for either n-type or p-type devices. The layer 190 may be about 100 Angstroms thick, which is thick enough to set the workfunction, but thin enough to ease patterning.

Finally, the layer 115 is a capping layer that may be between 200 and 1000 Angstroms thick in one embodiment of the present invention. The layer 115 material may be chosen so that known dry etchants may be used for patternability and resistance to wet etchants typically used in semiconductor processing. In particular, the layers 115 may be formed of a high conductivity metal such as aluminum, tungsten, or copper.

Thus, in some embodiments of the present invention, the gate structure shown in FIG. 1 can be used in a replacement metal gate process. In the replacement metal gate process, the cap metal layer 115 may use a material that exhibits excellent polishing characteristics. In the replacement metal gate process, the cap metal layer 115 is removable selectively from the interlayer dielectric with reduced dishing in one embodiment of the present invention. Examples of suitable layers 115 for a replacement metal gate process include tungsten, titanium nitride, tantalum, tantalum nitride, and copper.

FIGS. 2–10 illustrate structures that may be formed, when carrying out an embodiment of the method of the present invention. Initially, a high-k gate dielectric layer 105, 107, a sacrificial metal layer (not shown), and a sacrificial layer 104, 106 are formed and patterned on substrate 100, generating the FIG. 2 structure.

Some of the materials that may be used to make high-k gate dielectric layer 105, 107 include: hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, titanium oxide and aluminum oxide. Although a few examples of materials that may be used to form high-k gate dielectric layer are described here, that layer may be made from other materials that serve to reduce gate leakage. The layer has a dielectric constant higher than 10 and from 15 to 25 in one embodiment of the present invention.

High-k gate dielectric layer may be formed on substrate 100 using a conventional deposition method, e.g., a conventional chemical vapor deposition ("CVD"), low pressure CVD, or physical vapor deposition ("PVD") process. Preferably, a conventional atomic layer CVD ("ALD") process is used. In such a process, a metal oxide precursor (e.g., a metal chloride) and steam may be fed at selected flow rates into a CVD reactor, which is then operated at a selected temperature and pressure to generate an atomically smooth interface between substrate 100 and high-k gate dielectric layer 105, 107. The CVD reactor should be operated long enough to form a layer with the desired thickness. In most applications, high-k gate dielectric layer 105, 107 may be less than about 60 Angstroms thick, for example, and, in one embodiment, between about 5 Angstroms and about 40 Angstroms thick.

A sacrificial metal layer (not shown) may be formed over the dielectric layer. The sacrificial metal layer may be any metal that is capable of withstanding high temperatures (greater than 450° C.) without reaction with overlying materials. As one example, the sacrificial metal layer may be formed of titanium nitride. In one embodiment, the layer may be formed by sputtering. In another embodiment, the layer may be formed by atomic layer deposition.

After a high-k gate dielectric layer is formed on substrate 100, a sacrificial layer 104, 106 is formed on high-k gate dielectric layers 105, 107, respectively. In this embodiment, a hard mask layer 130, 131 is then formed on the sacrificial layer 104, 106. The sacrificial layer 104, 106 may comprise polysilicon and may be deposited on sacrificial metal layer using a conventional deposition process. Sacrificial layer 104, 106 may be, for example, between about 100 and about 2,000 Angstroms thick, and, in one embodiment, between about 500 and about 1,600 Angstroms thick.

Hard mask layer 130, 131 may comprise silicon nitride between about 100 and about 1000 Angstroms thick, for example, and between about 200 and about 350 Angstroms thick in one embodiment. Hard mask layer 130, 131 may be formed on sacrificial layer.

Conventional wet or dry etch processes may be used to remove unprotected parts of hard mask layer, sacrificial metal layer and sacrificial layer. In this embodiment, after those layers have been etched, exposed part of high-k gate dielectric layer is removed.

Although exposed part of high-k gate dielectric layer may be removed using dry or wet etch techniques, it may be difficult to etch that layer using such processes without adversely affecting adjacent structures. It may be difficult to etch high-k gate dielectric layer selectively to the underlying substrate using a dry etch process, and wet etch techniques may etch high-k gate dielectric layer isotropically—undercutting overlying sacrificial layers 104, 106 in an undesirable fashion.

To reduce the lateral removal of high-k gate dielectric layer, as exposed part of that layer is etched, exposed part of high-k gate dielectric layer may be modified to facilitate its removal selectively to covered part of that layer. Exposed part may be modified by adding impurities to that part of high-k gate dielectric layer after sacrificial layer has been etched. A plasma enhanced chemical vapor deposition ("PECVD") process may be used to add impurities to exposed part of high-k gate dielectric layer. In such a PECVD process, a halogen or halide gas (or a combination of such gases) may be fed into a reactor prior to striking a plasma. The reactor should be operated under the appropriate conditions (e.g., temperature, pressure, radio frequency, and power) for a sufficient time to modify the exposed part to ensure that it may be removed selectively to other materials. In one embodiment, a low power PECVD process, e.g., one taking place at less than about 200 Watts, is used.

In one embodiment, hydrogen bromide ("HBr") and chlorine ("$Cl_2$") gases are fed into the reactor at appropriate flow rates to ensure that a plasma generated from those gases will modify exposed part in the desired manner. Between about 50 and about 100 Watts wafer bias (for example, about 100 Watts) may be applied for a sufficient time to complete the desired transformation of exposed part. Plasma exposure lasting less than about one minute, and perhaps as short as 5 seconds, may be adequate to cause that conversion.

After the exposed part has been modified, it may be removed. The presence of the added impurities enables that exposed part to be etched selectively to covered part. In one embodiment, exposed part is removed by exposing it to a relatively strong acid, e.g., a halide based acid (such as hydrobromic or hydrochloric acid) or phosphoric acid. When a halide based acid is used, the acid preferably contains between about 0.5% and about 10% HBr or HCl by volume—and more preferably about 5% by volume. An etch process that uses such an acid may take place at or near room temperature, and last for between about 5 and about 30 minutes—although a longer exposure may be used if desired. When phosphoric acid is used, the acid may contain between about 75% and about 95% $H_3PO_4$ by volume. An etch process that uses such an acid may, for example, take place at between about 140° C. and about 180° C., and, in one embodiment, at about 160° C. When such an acid is used, the exposure step may last between about 30 seconds and about 5 minutes—and for about one minute for a 20 Angstrom thick film.

Figure 2:
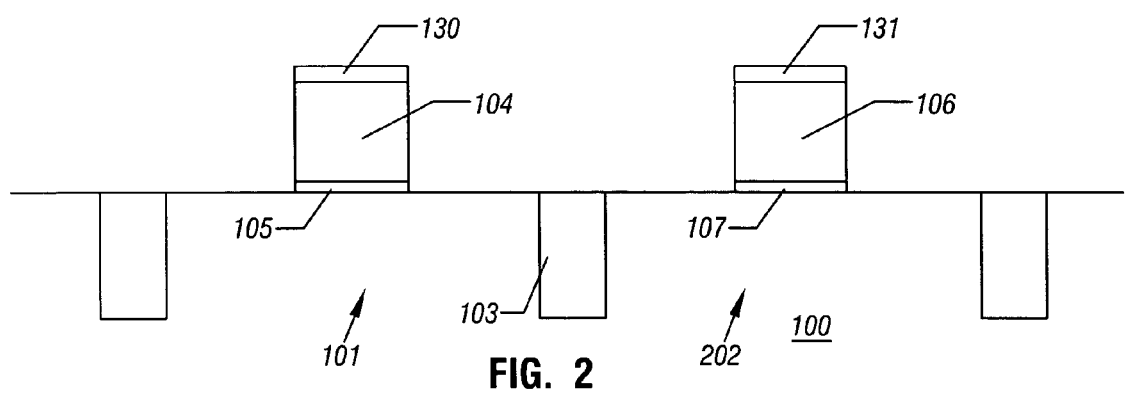
Figure 3:
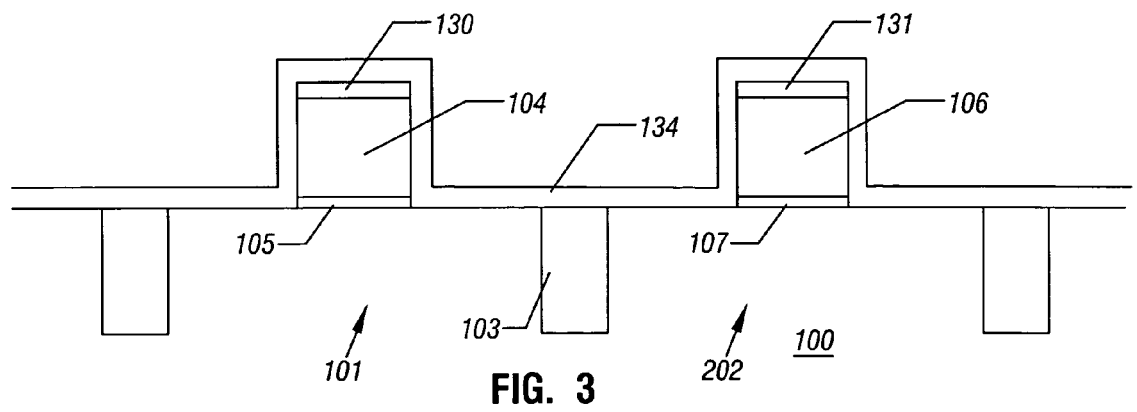

FIG. 2 represents an intermediate structure that may be formed when making a complementary metal oxide semiconductor ("CMOS"). That structure includes first part 101 and second part 102 of substrate 100. Isolation regions 103 separate first part 101 from second part 102. Isolation region 103 may comprise silicon dioxide, or other materials that may separate the transistor's active regions. First sacrificial layer 104 is formed on first high-k gate dielectric layer 105, and second sacrificial layer 106 is formed on second high-k gate dielectric layer 107. Hard masks 130, 131 are formed on sacrificial layers 104, 106.

After forming the FIG. 2 structure, spacers may be formed on opposite sides of sacrificial layers 104, 106. When those spacers comprise silicon nitride, they may be formed in the following way. First, a silicon nitride layer of substantially uniform thickness, for example, less than about 1000 Angstroms thick—is deposited over the entire structure, producing the structure shown in FIG. 2. Conventional deposition processes may be used to generate that structure.

In one embodiment, silicon nitride layer 134 is deposited directly on substrate 100 and opposite sides of sacrificial layers 104, 106—without first forming a buffer oxide layer on substrate 100 and layers 104, 106. In alternative embodiments, however, such a buffer oxide layer may be formed prior to forming layer 134. Similarly, although not shown in FIG. 3, a second oxide may be formed on layer 134 prior to etching that layer. If used, such an oxide may enable the subsequent silicon nitride etch step to generate an L-shaped spacer.

Figure 4:
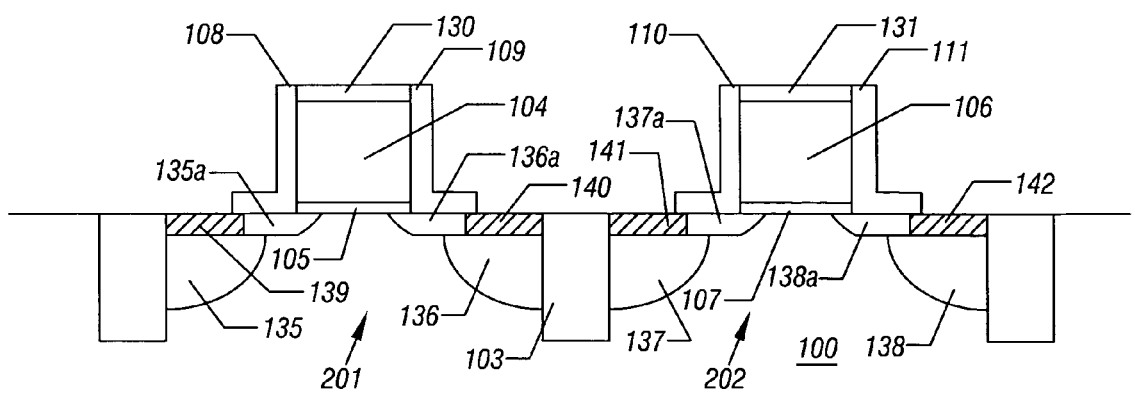

Silicon nitride layer 134 may be etched using a conventional process for anisotropically etching silicon nitride to create the FIG. 4 structure. As a result of that etch step, sacrificial layer 104 is bracketed by a pair of sidewall spacers 108, 109, and sacrificial layer 106 is bracketed by a pair of sidewall spacers 110, 111.

As is typically done, it may be desirable to perform multiple masking and ion implantation steps to create lightly implanted regions 135a–138a near layers 104, 106 (that will ultimately serve as tip regions for the device's source and drain regions), prior to forming spacers 108, 109, 110, 111 on sacrificial layers 104, 106. Also as is typically done, the source and drain regions 135–138 may be formed, after forming spacers 108, 109, 110, 111, by implanting ions into parts 101 and 102 of substrate 100, followed by applying an appropriate anneal step.

An ion implantation and anneal sequence used to form n-type source and drain regions within part 201 of substrate 100 may dope sacrificial layer 104 n-type at the same time. Similarly, an ion implantation and anneal sequence used to form p-type source and drain regions within part 202 of substrate 100 may dope sacrificial layer 106 p-type. When doping sacrificial layer 106 with boron, that layer should include that element at a sufficient concentration to ensure that a subsequent wet etch process, for removing n-type germanium containing layer 104, will not remove a significant amount of p-type sacrificial layer 106.

The anneal activates the dopants that were previously introduced into the source and drain regions and tip regions and into sacrificial layers 104, 106. In a preferred embodiment, a rapid thermal anneal is applied that takes place at a temperature that exceeds about 1,000° C.—and, optimally, that takes place at 1,080° C. In addition to activating the dopants, such an anneal may modify the molecular structure of high-k gate dielectric layers 105, 107 to create gate dielectric layers that may demonstrate improved performance.

Figure 5:
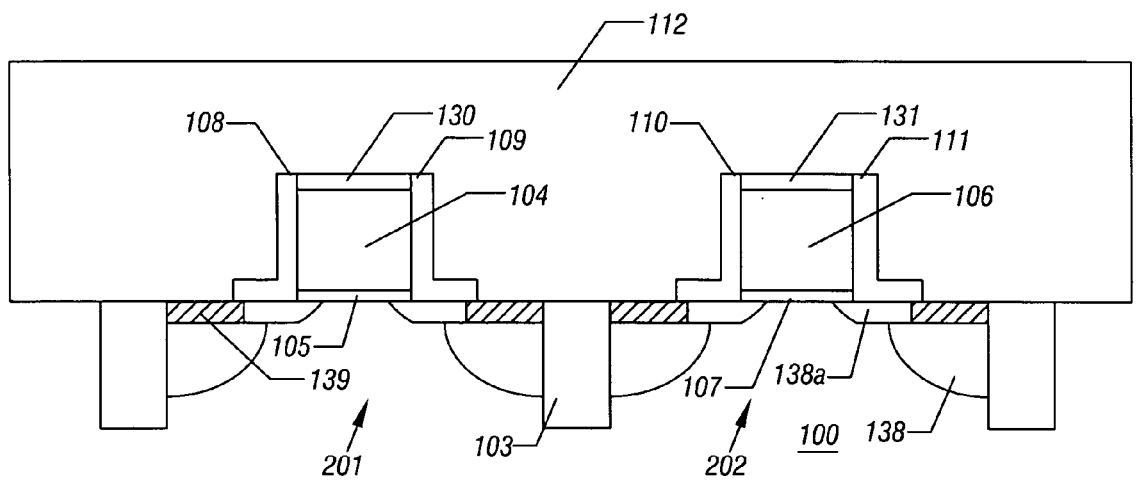

After forming spacers 108, 109, 110, 111, dielectric layer 112 may be deposited over the device, generating the FIG. 5 structure. Dielectric layer 112 may comprise silicon dioxide, or a low-k material. Dielectric layer 112 may be doped with phosphorus, boron, or other elements, and may be formed using a high density plasma deposition process. By this stage of the process, source and drain regions 135, 136, 137, 138, which are capped by silicided regions 139, 140, 141, 142, have already been formed. Those source and drain regions may be formed by implanting ions into the substrate, then activating them. Alternatively, an epitaxial growth process may be used to form the source and drain regions, as will be apparent to those skilled in the art.

Commonly used nitride spacer, source/drain, and silicide formation techniques to make the FIG. 5 structure. That structure may include other features—not shown, so as not to obscure the method of the present invention—that may be formed using conventional process steps.

Figure 6:
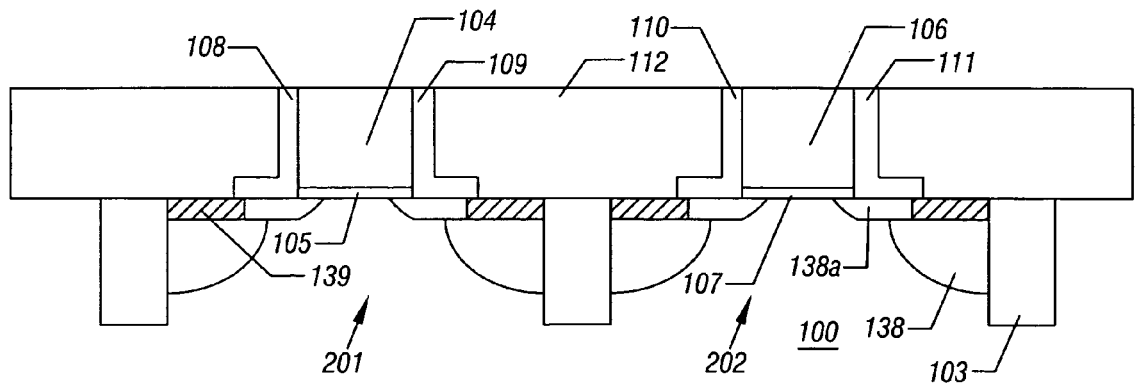

Dielectric layer 112 is removed from hard masks 130, 131, which are, in turn, removed from patterned sacrificial layers 104, 106, producing the FIG. 6 structure. A conventional chemical mechanical polishing ("CMP") operation may be applied to remove that part of dielectric layer 112 and hard masks 130, 131. Hard masks 130, 131 may be removed to expose patterned sacrificial layers 104, 106. Hard masks 130, 131 may be polished from the surface of layers 104, 106, when dielectric layer 112 is polished—as they will have served their purpose by that stage in the process.

Figure 7:
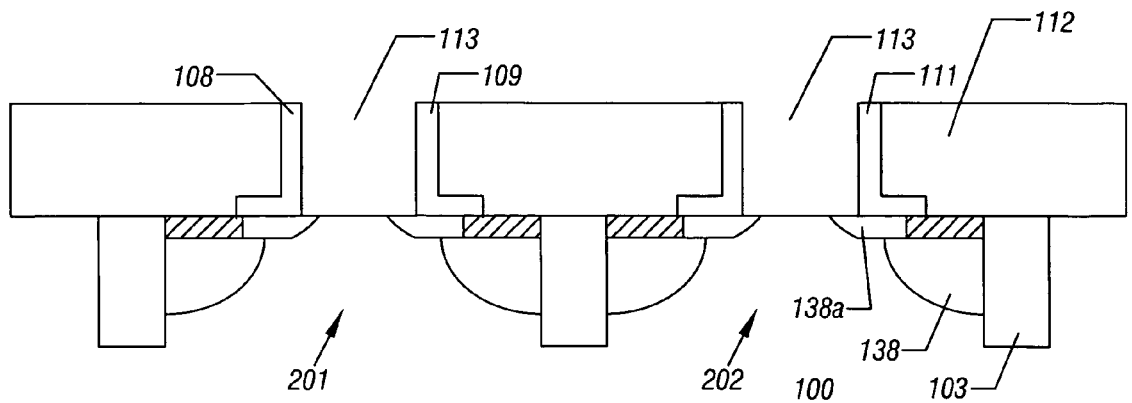

After forming the FIG. 6 structure, sacrificial layers 104 or 106 are removed to generate trenches 113, producing the structure shown in FIG. 7. A 1% solution of HF may be used for 15 to 30 seconds to remove the chemical oxide formed over the remaining polysilicon.

In a second embodiment (not shown), a wet etch process that is selective for layers 104 over layers 106 is applied to remove layers 104 without removing significant portions of layers 106. When sacrificial layer 104 is doped n-type, and sacrificial layer 106 is doped p-type (e.g., with boron), such a wet etch process may comprise exposing sacrificial layer 104 to an aqueous solution that comprises a source of hydroxide for a sufficient time at a sufficient temperature to remove substantially all of layer 104. That source of hydroxide may comprise between about 2 and about 30 percent ammonium hydroxide or a tetraalkyl ammonium hydroxide, e.g., tetramethyl ammonium hydroxide ("TMAH"), by volume in deionized water. Any remaining sacrificial layer 104 may be selectively removed by exposing it to a solution, which is maintained at a temperature between about 15° C. and about 90° C. (for example, below about 40° C.), that comprises between about 2 and about 30 percent ammonium hydroxide by volume in deionized water. During that exposure step, which preferably lasts at least one minute, it may be desirable to apply sonic energy at a frequency of between about 10 kHz and about 2,000 kHz, while dissipating at between about 1 and about 10 Watts/cm².

In the second embodiment, sacrificial layer 104, with a thickness of about 1,350 Angstroms, may be selectively removed by exposing it at about 25° C. for about 30 minutes to a solution that comprises about 15 percent ammonium hydroxide by volume in deionized water, while applying sonic energy at about 1,000 kHz—dissipating at about 5 Watts/cm². Such an etch process should remove substantially all of an n-type sacrificial layer without removing a meaningful amount of a p-type sacrificial layer.

As a third embodiment, sacrificial layer 104 may be selectively removed by exposing it for at least one minute to a solution, which is maintained at a temperature between about 60° C. and about 90° C., that comprises between about 20 and about 30 percent TMAH by volume in deionized water, while applying sonic energy. Removing sacrificial layer 104, with a thickness of about 1,350 Angstroms, by exposing it at about 80° C. for about 2 minutes to a solution that comprises about 25 percent TMAH by volume in deionized water, while applying sonic energy at about 1,000 kHz—dissipating at about 5 Watts/cm²—may remove substantially all of layer 104 without removing a significant amount of layer 106. First high-k gate dielectric layer 105 should be sufficiently thick to prevent the etchant that is applied to remove sacrificial layer 104 from reaching the channel region that is located beneath first high-k gate dielectric layer 105.

In some embodiments, a dielectric layer 105 and/or 107 may be removed before forming a replacement metal gate. In such case, a metal oxide gate dielectric 180 may be formed before forming the replacement gate as shown in FIG. 8.

Figure 8:
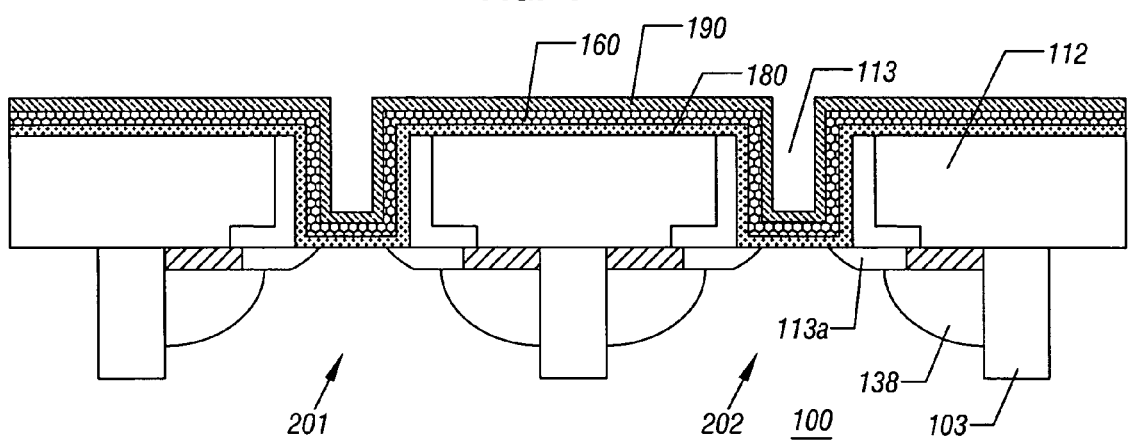

Next, in FIG. 8, the layer 160 may be deposited to act as a barrier and adhesion layer. It may prevent reactions between high-k gate dielectrics 105, 107 and overlying metal layers 190. It may also provide a nitrogen source for the high-k dielectric. Next, the layer 190 may be deposited to act as a workfunction layer. It sets the transistor threshold voltage.

Figure 9:
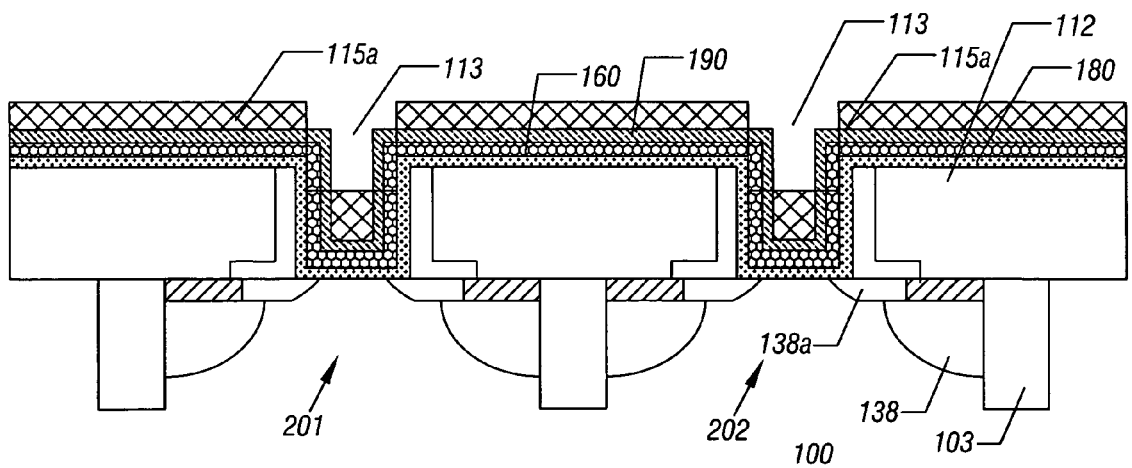
Figure 10:
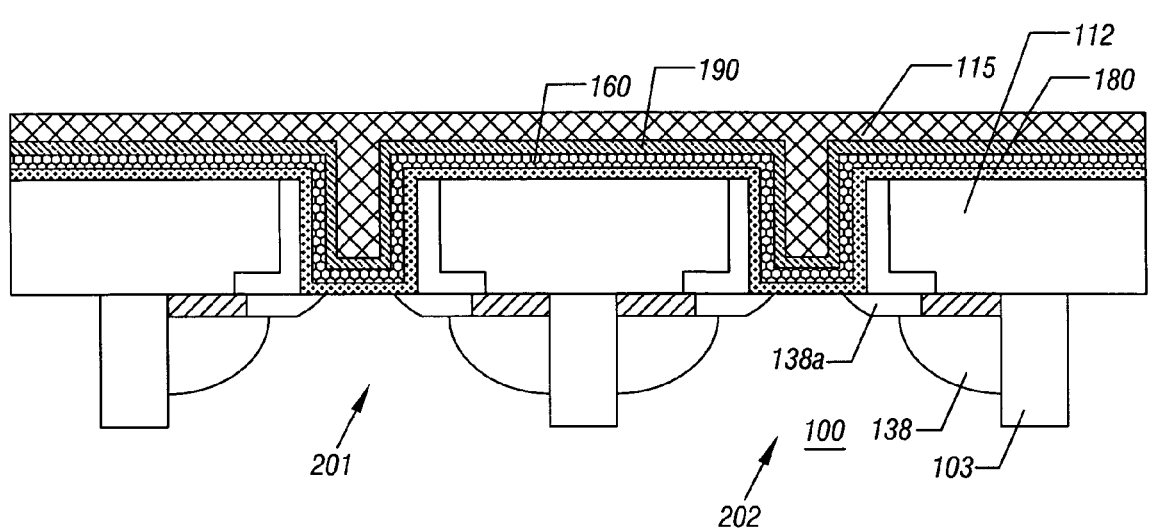

Referring to FIG. 9, after formation of the layer 190, a contact/gap fill can be implemented by applying a bottom up superconformal filling (superfill), indicated at 115a. The filling may be done using electroplating, ALD, CVD, or aluminum reflow, to mention a few examples. The gap fill materials may include high conductivity metals (i.e., those with a relative conductivity of greater than 28, relative to copper at 100, at 20° C.) such as aluminum, tungsten, or copper. The electroplating solutions can contain metal ions, base, such as TMAH or $NH_4OH$ or acid, such as $H_2SO_4$ or methylsulfonic acid (MSA) to provide electrolyte conductivity, and accelerators such as a disulfide. The accelerator may be accumulated in the small features at the bottom surface due to rapid reduction in surface area during plating providing bottom up fill. Sonication may be utilized to aid in gap fill. The completed superfill is shown in FIG. 10 with cap metal layer 115. After chemical mechanical planarization (CMP), the structure of FIG. 1 results.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An integrated circuit comprising:
   a substrate;
   a high dielectric constant gate dielectric over said substrate;
   a metal barrier layer over said gate dielectric;
   a U-shaped workfunction setting metal layer over said metal barrier layer;
   a cap metal layer over said workfunction setting metal layer;
   wherein said circuit is a complementary metal oxide semiconductor circuit including NMOS and PMOS transistors; and
   wherein both the NMOS and PMOS transistors of said complementary metal oxide semiconductor circuit include the cap metal layer over the workfunction setting metal layer over the metal barrier layer over the gate dielectric.

2. The circuit of claim 1 wherein said NMOS transistor includes a workfunction setting metal having a workfunction between 3.9 and 4.2 eV and a thickness of about 100 Angstroms.

3. The circuit of claim 1 wherein said PMOS transistor includes a workfunction metal having a workfunction of 4.9 to 5.2 eV and a thickness of about 100 Angstroms.

4. The circuit of claim 1 wherein said metal barrier layer includes a nitrogen containing metal.

5. The circuit of claim 1 wherein said cap metal layer has a thickness between 200 and 1000 Angstroms.

* * * * *